United States Patent [19]
Bae et al.

[11] Patent Number: 5,993,595
[45] Date of Patent: Nov. 30, 1999

[54] OZONE ASHER

[75] Inventors: Koon-Ho Bae, Seoul; Sang-Yun Lee, Ichon; Hyung-Chang Kang, Ichon; Cheong-Dai Lee, Ichon; Roh-Young Sung; Sun-Dong Park, both of Seoul; Jong-Hyun Park, Ichon, all of Rep. of Korea

[73] Assignee: Hyundai Electronics Industries Co., Ltd., Kyoungki-do, Rep. of Korea

[21] Appl. No.: 08/728,639

[22] Filed: Oct. 10, 1996

[30] Foreign Application Priority Data

Oct. 10, 1995 [KR] Rep. of Korea ................. 95/28278

[51] Int. Cl.$^6$ ............................................. H05H 1/00
[52] U.S. Cl. ............................................. 156/345
[58] Field of Search ................. 156/345; 118/728, 118/729, 725, 500; 204/298.15, 298.33, 298.07

[56] References Cited

U.S. PATENT DOCUMENTS

| | | |
|---|---|---|
| 4,812,201 | 3/1989 | Sakai et al. |
| 4,838,978 | 6/1989 | Sekine et al. ............ 156/345 |
| 5,176,782 | 1/1993 | Ishibashi et al. ......... 156/345 |
| 5,558,717 | 9/1996 | Zhao et al. ............... 118/715 |

FOREIGN PATENT DOCUMENTS 63-32927   2/1988   Japan.

*Primary Examiner*—Thi Dang
*Attorney, Agent, or Firm*—Ware, Fressola, Van Der Sluys & Adolphson LLP

[57] ABSTRACT

An ozone asher includes: a chamber having a closed space isolated from an atmosphere, and an opening through which the semiconductor substrate to be etched is inserted and withdrawn from the chamber; an upper cover forming an upper portion of the chamber, having ozone injection holes for supplying ozone into the chamber; a plurality of holders for holding the semiconductor substrate inserted in the chamber through the opening; a pedestal provided to be raised and lowered in the chamber and supporting the semiconductor substrate during the whole procedure; vacuum means provided at the pedestal for drawing and holding the semiconductor substrate to the pedestal; heating means for the semiconductor substrate provided at the pedestal; means for raising and lowering the pedestal and the heating means; means for keeping a gap between the pedestal and the upper cover during the elevating of the semiconductor substrate; and a slit door for opening and closing the opening of the chamber selectively.

20 Claims, 11 Drawing Sheets

OZONE ASHER

FIELD OF THE INVENTION

The present invention relates to an ozone asher for removing a photoresist layer formed on a semiconductor substrate by pure chemical reaction using radical components of ozone.

PRIOR ART

Generally, there is known a method for forming a semiconductor device including the steps of: coating a photoresist film on the semiconductor substrate; forming a photoresist mask of the predetermined pattern by exposing the photoresist film to the light; etching the exposed portions of a layer which has no photoresist mask thereon; using the mask as an etching barrier; and removing the mask.

After the exposed portions are removed, the mask is removed by the commercialized plasma etching method using radio frequency (RF) or microwave. In the plasma etching method, a chemical reaction wherein ions and/or radical component of plasma react with the photoresist mask, and a physical reaction wherein ions of plasma collide with the photoresist mask, concurrently occur.

In this method, however, a damage is generated at the exposed surface of the semiconductor substrate when removing the photoresist mask since the radical or ion component of the plasma not only removes the photoresist mask but also penetrates into the exposed portion of the semiconductor substrate. In addition, a heavy metal ion of Na+ is generated upon removing the photoresist mask, which can penetrate into the semiconductor substrate. The resulting damage can be serious, to the point where the semiconductor substrate must be discarded.

There has been provided a method for removing the photoresist mask using only the chemical reaction which reacts the radical components with the photoresist mask, so as to resolve the above-mentioned problem. More specifically, the photoresist mask has a molecular structure of C—H—O, and chains for connecting respective molecules are cut by a reaction with the radical components of ozone. When the temperature in the ozone-filled plasma chamber reaches a predetermined level, the ozone therein is readily converted to the radical components. Therefore, when the plasma chamber is heated to a predetermined temperature range in the sealed state, ozone is converted to the radical components and is reacted chemically with the photoresist mask, whereby the photoresist mask can be removed from the semiconductor substrate without the above mentioned damage.

The conventional ozone asher as described above is provided with a pedestal for holding the semiconductor substrate in the chamber. The semiconductor substrate is drawn in and held to the pedestal by vacuum force. A heating device for converting ozone to the radical components is provided at the lower surface of the pedestal, and three pin holes are formed at a predetermined portion of the pedestal. Three lift pins able to move in a rising and lowering motion, are inserted in the respective pin holes. An upper cover capable of being raised and lowered is mounted to the upper portion of the chamber, so that it is possible to insert the semiconductor substrate into the chamber or withdraw the semiconductor substrate from the chamber. At the upper cover ozone injection holes are formed to communicate with the ozone generator and an exhaust hole, respectively.

The operation of the general ozone asher as described above is as follows.

First, the semiconductor substrate is inserted, with the upper cover moving up and being open. At this time, the semiconductor substrate is loaded on the three lift pins positioned at a slightly higher position than the pedestal. When the semiconductor substrate is loaded on the three lift pins, the lift pins move downward so that the semiconductor substrate is supported and held to the pedestal by the suction of the vacuum device. As the step of fixing the semiconductor substrate is completed, the upper cover is closed down, sealing the chamber.

Then, as the heating device is operated, ozone is introduced into the chamber. At this time, the temperature of the inside of the chamber should be in range of 300° C. to 400° C., which is sufficient to convert ozone into the radical components. The radical components react chemically with the photoresist mask on the semiconductor substrate, resulting in the removal of the photoresist mask. The residual gas and other reactive gases are exhausted through the exhaust hole.

In the conventional ozone asher, however, there is the possibility for some amount of ozone to leak through the pin holes formed in the pedestal from the lift pins being raised and lowered through the pin holes before the semiconductor substrate is loaded thereon. In order to prevent this leakage of ozone, there is provided a method of inserting o-shaped rings at the entrance of the pin holes. There is a problem in that the chamber cannot be completely sealed since the inside temperature of the chamber is elevated to a range of 300° C. to 400° C. during the etching process which results in warping of the o-shaped rings.

Although the leakage amount of ozone to the atmosphere is small, the photoresist mask is not completely removed and remains because only a precise amount of ozone is introduced into the chamber to prevent the overetching or underetching of the photoresist mask. The remaining photoresist mask negatively affects processes that follow. Thus, it is important to ensure that the chamber is in a sealed state.

SUMMARY OF THE INVENTION

The object of the present invention is to provide an ozone asher that prevents ozone from leaking from the chamber and that provides a more effective manufacturing procedure.

To achieve the above object, the ozone asher according to the present invention comprises: a chamber having a closed space isolated from atmosphere; an opening for the chamber through which the semiconductor substrate is inserted and withdrawn; an upper cover forming an upper portion of the chamber, having ozone injection holes for supplying ozone into the chamber; a plurality of holders for keeping the semiconductor substrate in place when being inserted and withdrawn from the chamber; a pedestal provided to be raised and lowered in the chamber and supporting the semiconductor substrate during the whole procedure; vacuum means provided at the pedestal for drawing and holding the semiconductor substrate to the pedestal; heating means for the semiconductor substrate provided at the pedestal; means for raising and lowering the pedestal and the heating means; means for keeping a gap between the pedestal and the upper cover during the elevating of the semiconductor substrate; and a slit door for opening and closing the opening of the chamber.

According to the present invention, the ozone injection holes are formed at the 3 points set apart at equal angles of 120°, respectively, on the upper cover wherein they are communicated mutually through a circular communicating hole.

Also, an inner disk and an outer disk are positioned in the inside of the upper cover to form a gap between the ozone injection holes, thereby forming an insulating space between the inner disk and the upper cover.

To prevent the ozone injected through the ozone injection holes from converting too early into the radical components, the upper cover has a cooling means consisting of a coolant path.

The semiconductor substrate holders provided at the upper cover are located at least three positions around the center of the outer disk to support the supplied semiconductor substrate, and the inlet holes corresponding to the positions and the shape of the holders are formed in the pedestal so that when the pedestal is raised, the semiconductor substrate holders are accommodated in the inlet holes whereby the semiconductor substrate is laid on the pedestal.

The semiconductor substrate holders include a fixing part attached to the lower surface of the outer disk and a supporting part extended horizontally from the fixing part, and the supporting part is composed of an upper portion and a lower portion wherein an inclined surface exists between the lower portion and the upper portion so that the semiconductor substrate to be inserted into the chamber is guided smoothly from the upper portion to the lower portion to be exactly placed thereon. It is preferable that the angle of the inclined surface is from 50° to 70°.

The vacuum means formed at the surface of the pedestal comprises a plurality of annular vacuum grooves having various diameters from the center to its circumference and vacuum channels set apart at equal angles of 120° for communicating with the vacuum grooves and formed in the inside of the pedestal, vacuum pipes extended downwards from the end of the vacuum channels and, vacuum tubes connecting the vacuum pipes to the vacuum source pump. Female screws are formed at the inner surface of the vacuum pipes and male screws are formed at the outer surface of the vacuum tube so they are engaged with each other.

The heating means is a heater made by locating a heating coil at the inside of the circular housing and, under the heating device, an insulating plate for preventing a heat conduction to the outside is attached to the pedestal so as to be spaced from the pedestal. Also, a thermocouple for sensing the temperature of the heater is provided through the pedestal so as to make contact with the heater so that the temperature control of the procedure can be possible. The insulating plate is made of ceramic.

The means for raising and lowering the pedestal includes an air cylinder attached to a base plate and to an end of a rod of which another end is connected to the middle portion of the swing disk after passing through a lower plate. The pedestal is attached to the top of swing disk. A ball link connects the swing disk to the rod so that the swing disk can be pivoted with its rising and lowering movement. A dish spring is provided with the ball link so that the swing disk does not over-pivot. A bellows tube is provided between the swing disk and the lower plate as well as around the center of the rod so as to smooth the rising and lowering movement of the swing disk.

The rod has an upper portion connected to the swing disk and a lower portion connected to the air cylinder and the upper and lower portion of the rod are coupled by connecting members so as to keep a space between them. A spring is provided to the connecting members to support the upper and lower portions of the rod so any impact to the swing disk is absorbed during its rising and lowering movement.

The gap keeping means includes a plurality of gap spacers located at the lower surface of the outer disk at the equal angle of 120° and contacting with the pedestal to prevent the pedestal from over-moving upwards.

The slit door is connected to the air cylinder and moved up and down so that the opening of the chamber is selectively open and closed.

In accordance with the present invention, the leakage of ozone from the chamber is prevented and the semiconductor substrate is kept level during the etching procedure thereby enhancing etching uniformity.

BRIEF DESCRIPTION OF THE DRAWINGS

These and other features, aspects, and advantages of the present invention will become better understood with regard to the following description, appended claims, and accompanying drawings wherein:

DETAILED DESCRIPTION

Figure 1A:
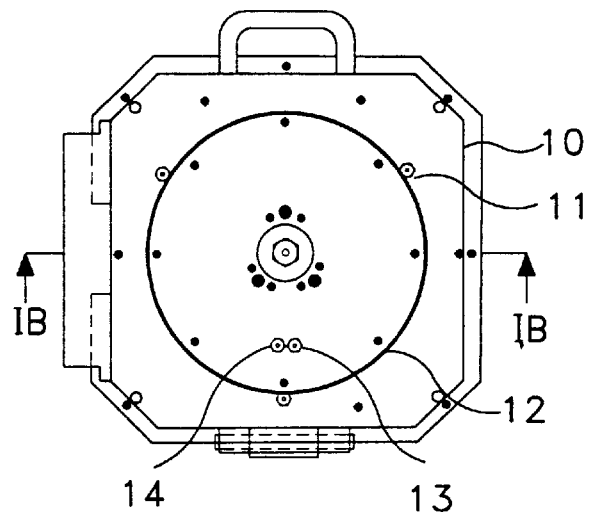
FIG. 1A is a plan view of the ozone asher according to the present invention.
Figure 1B:
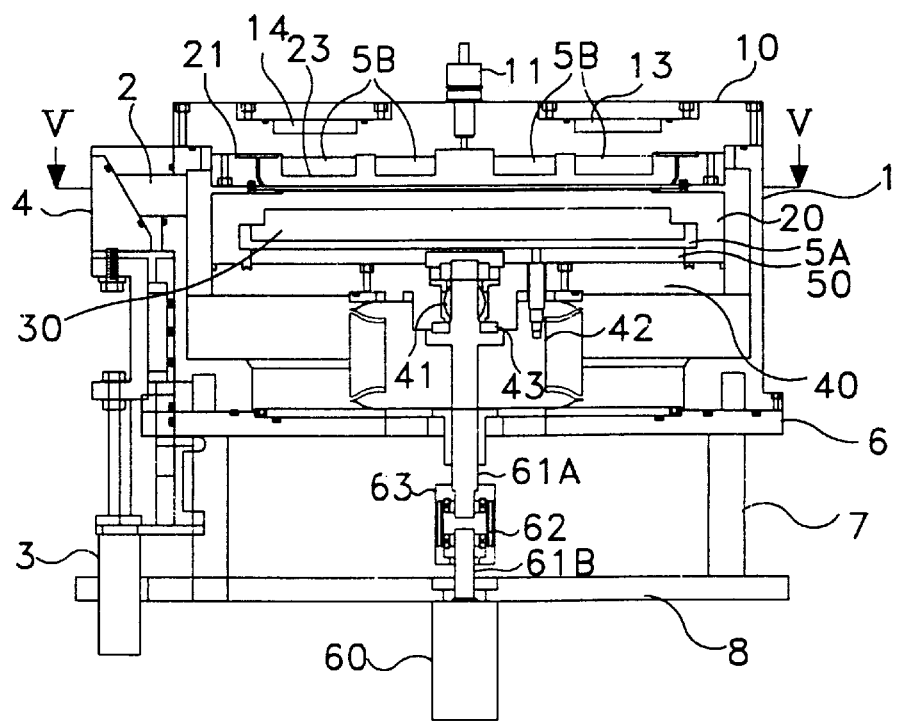
FIG. 1B is a sectional view taken in line 1B—1B of FIG. 1.

As shown in FIGS. 1A and 1B, a chamber 1 has an opening 2 formed on one side of the chamber for inserting and withdrawing a semiconductor substrate W. The chamber 1 is mounted on a lower plate 6 and the lower plate 6 is attached to a base plate 8 by a supporting shaft 7.

Ozone injection holes 11 formed in upper cover 10 are connected to an ozone generator(not shown), and the upper cover 10 is mounted, so to be able to rotate, at the upper portion of the chamber 1 to close it. A slit door 4 is located at the entrance of the opening 2 of the chamber 1 and connected to the first air cylinder 3 mounted on the base plate 8 so that the opening 2 is opened and closed selectively by means of the slit door 4.

A pedestal 20 is located in the chamber 1 on which the semiconductor substrate W is placed. A heating device 30 for heating the semiconductor substrate lying on the pedestal 20 to the processing temperature is attached to the lower surface of the pedestal 20.

An insulating plate 50 for preventing a heat loss is mounted near the lower portion of the heater 30 so that a space 5a is formed between the insulating plate 50 and the heater 30. The insulating plate is preferably made of ceramic material having a high level of heat resistance.

A swing disk 40 is attached to the lower portion of the insulating plate 50 so as to support the insulating plate 50, the pedestal 20 and the heater 30. The swing disk 40 is raised and lowered by the second air cylinder 60 mounted on the base plate 8.

A rod 61 connects the swing disk 40 and the second air cylinder 60 resulting in the pedestal 20, the heater 30 and the insulating plate 50 moving up integrally with the swing disk 40 so that the semiconductor substrate loaded in the chamber 1 is supported.

In other words, when upper cover 10 is fixed in place, the pedestal 20 is raised and lowered while the semiconductor substrate is inserted and withdrawn through the opening 2. In addition, the pedestal 20 moves back into position with each new semiconductor substrate entered.

Figure 2:
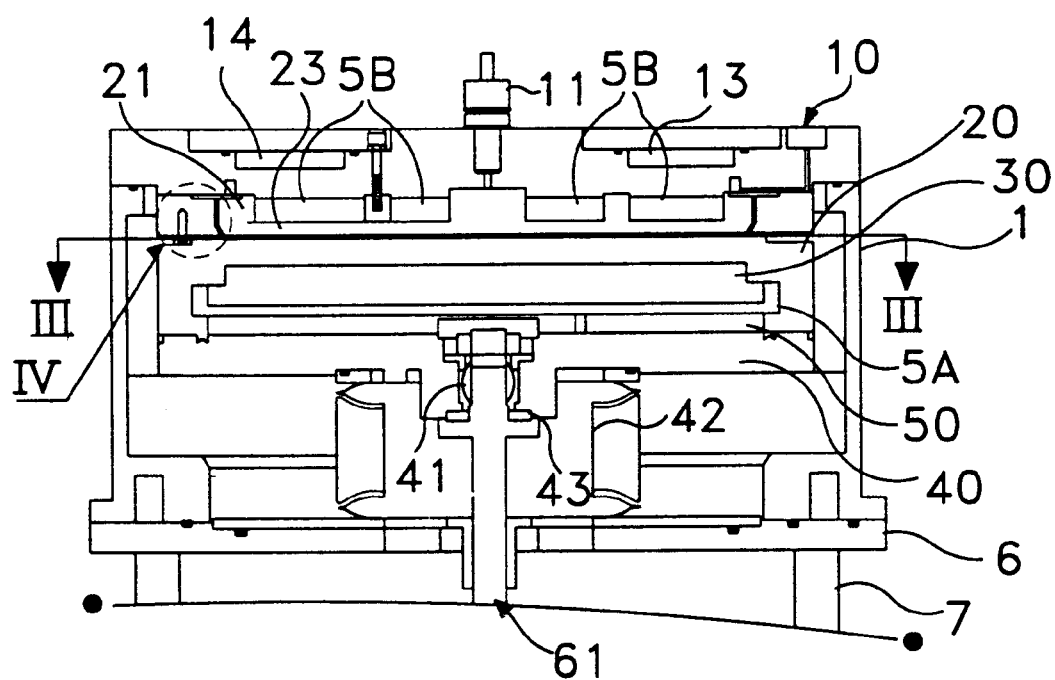
FIG. 2 is a front view of the gap keeping device according to the present invention.

Referring to FIGS. 1A, 1B and 2, the ozone injection holes 11 are formed on 3 points of the upper cover 10 at the equal angle of 120° respectively and they are communicated mutually through a circular passage 12.

To prevent the ozone injected into the passage 12 through the ozone infection hole 11 from early conversion into the radical components before the ozone is inserted into the chamber 1 in a high temperature state, a coolant inlet and a outlet 13 and 14 are formed on the inside of the passage 12 for cooling the ozone and they are communicated to each other by a coolant path 13A, 14A.

Figure 4:
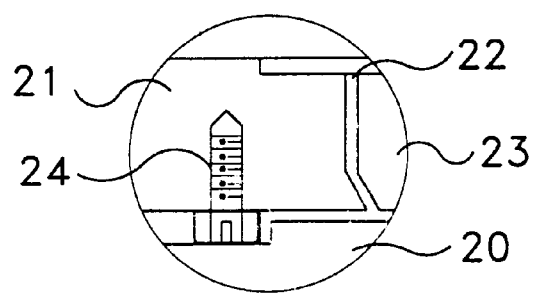
FIG. 4 is a detailed view taken in the portion IV of FIG. 2.

As shown in FIG. 4, an outer disk 21 is provided on the lower surface of the upper cover 10 and an inner disk 23 is provided inside the outer disk 21 separated by a gap 22. The gap 22 is formed to incline towards the semiconductor substrate on the pedestal 20. The inner disk 23 is placed apart from the upper cover 10 by a distance so that a space 5b is formed and the heat of the chamber 1 is prevented from being conducted to the outside.

Figure 3:
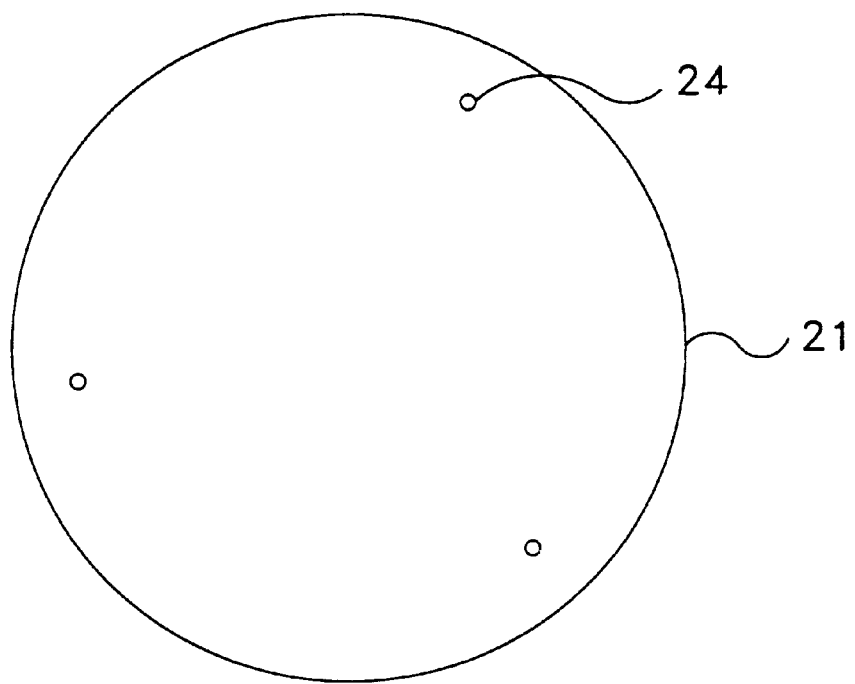
FIG. 3 is a sectional view taken in line III—III of FIG. 2.

A gap spacer 24 shown in FIG. 4 is mounted at the lower end of the outer disk 21 by a bolt so as to regulate the horizontal location of the pedestal 20. In other words, the gap spacer 24 regulates constantly the gap between the outer disk 21 and pedestal 20. The gap spacer 24 is preferably located at the 3 points apart at the equal angles of 120° on the outer disk 21, as shown in FIG. 3. The gap spacers 24 contact the upper surface of the pedestal 20 that is moved upwards by the second air cylinder 60, so as to keep the pedestal 20 level.

The swing disk 40 which is provided with a shaft hole at its center is mounted on the lower surfaces of the pedestal 20 and the insulating plate 50. The rod 61 is inserted into the shaft hole of the swing disk 40. A ball link 41 is mounted to the rod 61 so that the swing disk 40 can be pivoted with the rod 61 as its center. Furthermore, a bellows 42 is mounted between the swing disk 40 and the lower plate 6 and contracted and expanded according to the rising and lowering movement of the rod 61 thereby guiding smoothly the movement of the pedestal 20. A dish spring 43 is mounted between the center of the swing disk 40 and the end of the rod 61 to prevent the over-pivoting of the swing disk 40.

Figure 5:
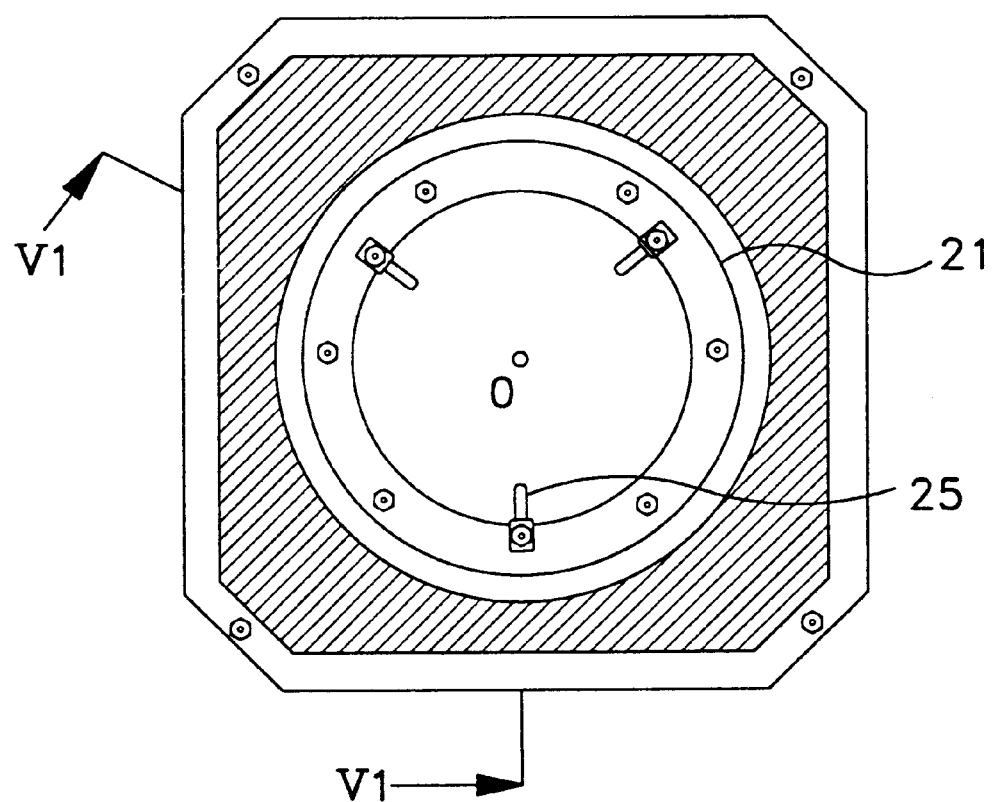
FIG. 5 is a sectional view of the mounting position of the semiconductor substrate holder taken in line V—V of FIG. 1B.
Figure 6:
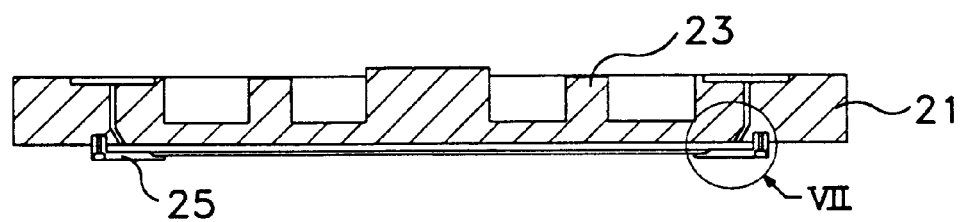
FIG. 6 is a sectional view taken in line VI—VI of FIG. 5.
Figure 7:
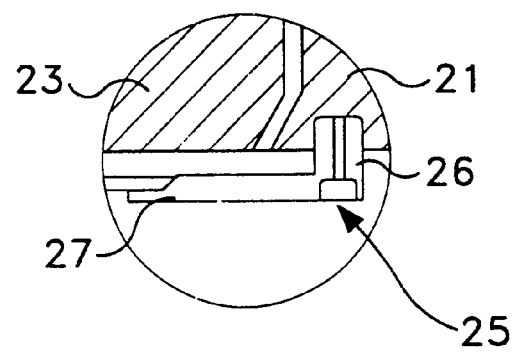
FIG. 7 is a detailed view taken in the portion VII of FIG. 6.

Referring to FIG. 5, holders 25 for supporting the semiconductor substrate are located at 3 points set apart at equal angles of 120° on the outer disk 21. FIG. 6 is a sectional view taken in line VI—VI of FIG. 5 and shows a semiconductor substrate W resting on holders 25 under the inner disk 23. As shown in the detailed view taken in the portion VII of FIG. 6 as shown in FIG. 7, each of the holders 25 includes a fixing part 26 attached to the outer disk 21 and a supporting part 27 extended horizontally from the fixing part 26. The supporting part 27 is composed of an upper portion and a lower portion wherein an inclined surface exists between the lower and upper portions. The purpose of the above structure is so that the semiconductor substrate is guided smoothly from the upper portion to the lower portion to be exactly placed thereon. The angle of the inclined surface should range from 50° to 70° with 60° being the most preferable angle.

Figure 8:
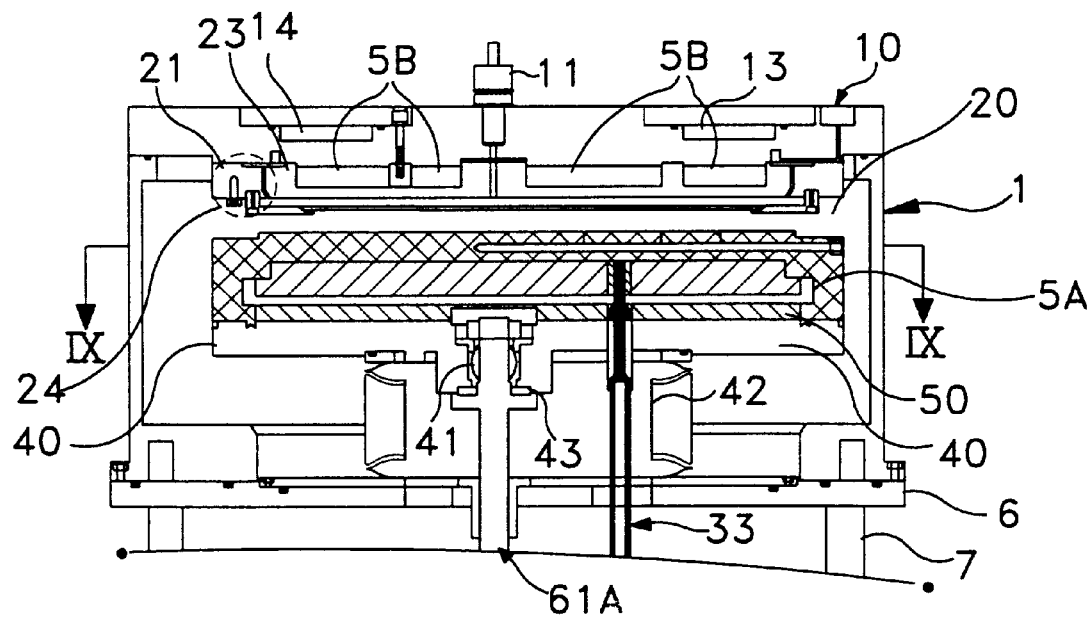
FIG. 8 is a sectional view showing the mounting state of the vacuum tube according to the present invention.
Figure 9:
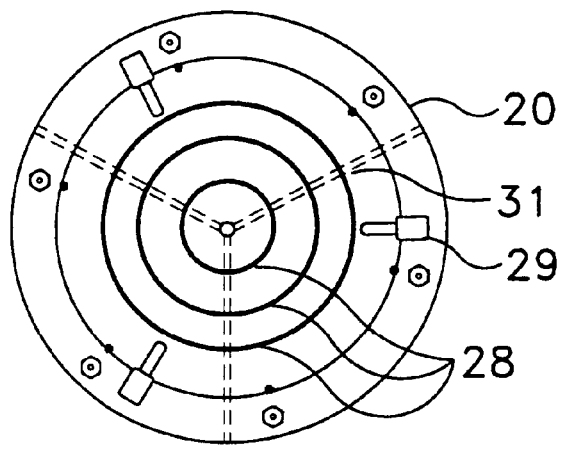
FIG. 9 is a plan view of the pedestal showing the mounting state of the vacuum tube according to the present invention.
Figure 10:
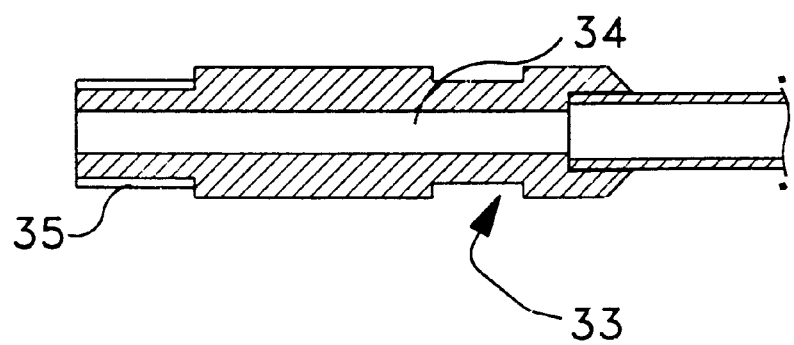
FIG. 10 is a sectional view of the vacuum tube.

As shown in FIGS. 8 to 10, three inlet holes 29 are formed on the pedestal 20 to match with the positions and the shape of the holders 25 so that the holders 25 can fit therein. Also, three annular vacuum grooves 28 having various diameters are formed on the pedestal 20. At corresponding positions, three vacuum channels 31 communicating with the vacuum grooves 28 are formed at equal angles of 120°. Vacuum pipes 32 extend downwards from the vacuum channels 31 through the pedestal 20, the heater 30 and the insulating plate 50. On the inner surface of the vacuum pipes 32, there is also formed a female screw which is mounted through the insulating plate 50. Vacuum tubes 33 communicated with the vacuum pump (not shown) are inserted into the vacuum pipes 32 respectively. Each of the vacuum tubes 33 has a vacuum path 34 and a male screw portion 35 formed at its end corresponding to the female screw portion of the vacuum pipe 32 so that they are engaged.

Figure 11A:
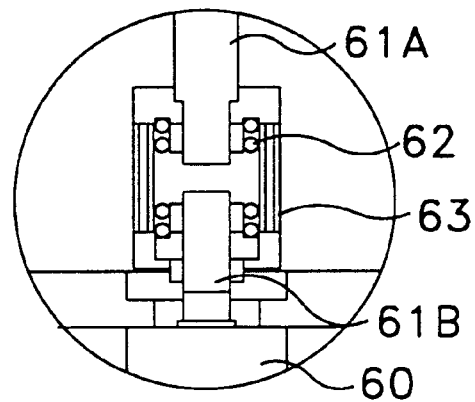
FIG. 11A shows the down load state of the pedestal indicating the structure and operation of two separate rods.
Figure 11B:
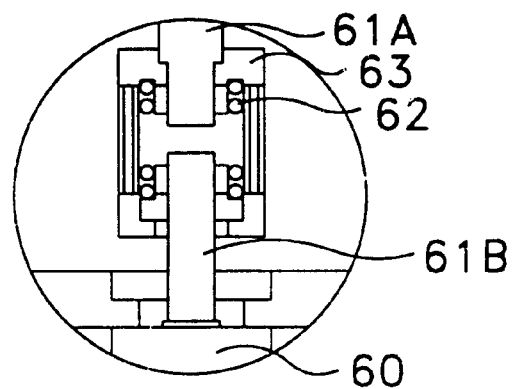
FIG. 11B shows the up load state of the pedestal.

Referring to FIGS. 11A and 11B, the rod 61 is divided into the first portion 61a connected to the pedestal 20 and the second portion 61b connected to the air cylinder 60. They are connected to each other by a connecting member 63 such that a space exists between them. Coil springs 62 are placed between the connecting member 63 and the first and the second portion 61a and 61b so that each of the coil springs 62 absorbs an impact generated by a contact of the pedestal 20 and the gap spacer 24. Therefore, any damage to parts due to the impact-absorbing effect of the coil springs 62 mentioned above can be prevented.

Figure 12:
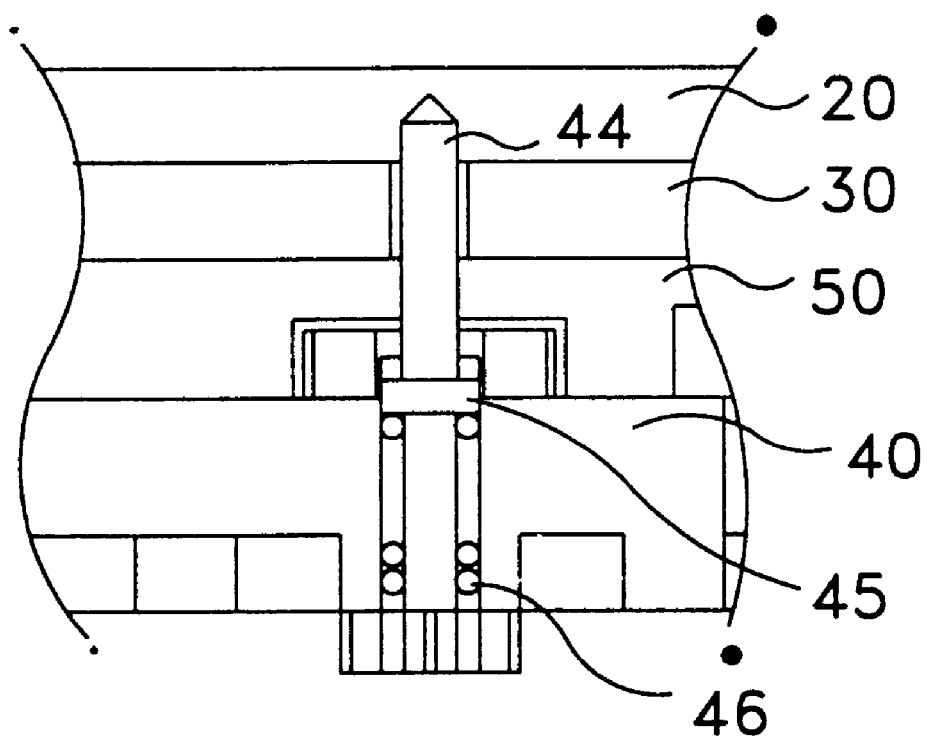
FIG. 12 is a detailed view showing the mounting position and structure of the thermocouple.

In the meantime, according to the present invention as shown in FIG. 12, there is provided a thermocouple 44 for sensing the temperature of the pedestal 20 when heated by the heater 30, for use in controlling the processing temperature. The thermocouple 44 is inserted into a hole existing through the swing disk 40, the insulating plate 50 and the heater 30 as shown in FIG. 12. A collar 45 of the thermocouple 44 is located at an upper part of the shaft hole of the swing disk 40. At assembly of the thermocouple 44, a spring 46 is provided at the outer circumference of the lower portion of the collar 45 to push the distal end of the thermocouple into the pedestal 20.

Figure 13A:
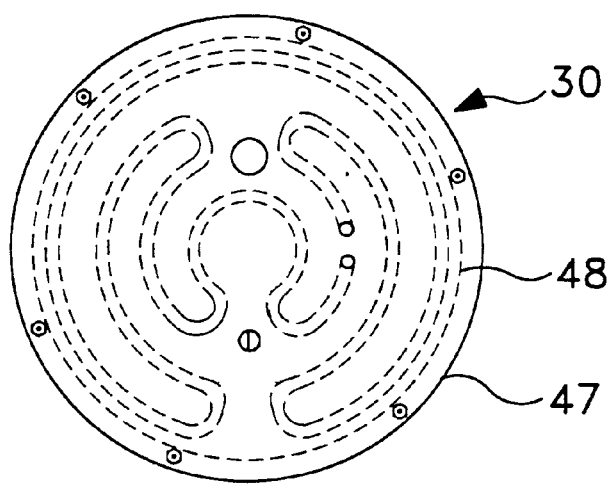
FIG. 13A is a plan view of the heating device according to the present invention.
Figure 13B:
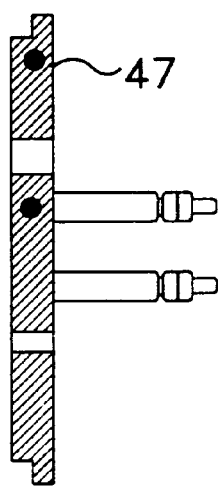
FIG. 13B is a side sectional view of the heating device.

Referring to FIGS. 13A & 13B, the heater 30 has a coil heater 48 arranged uniformly into a circular housing 47, the coil heater 48 being used to heat the front face of the pedestal 20 at a uniform temperature.

Figure 14A:
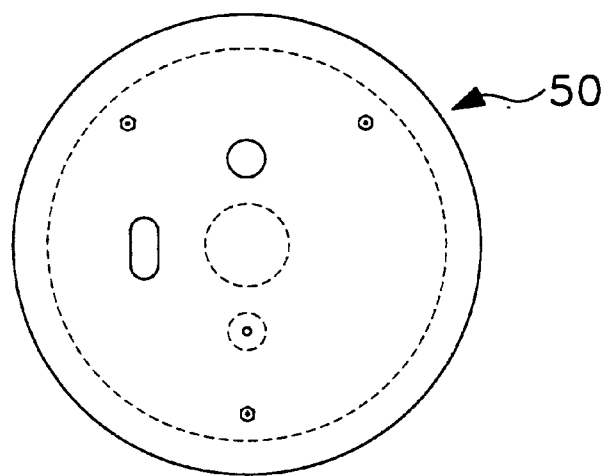
FIG. 14A is a plan view of the insulating plate according to the present invention.
Figure 14B:
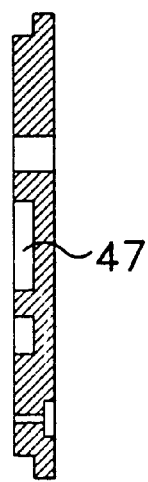
FIG. 14B is a side sectional view of the insulating plate.
Figure 1A:
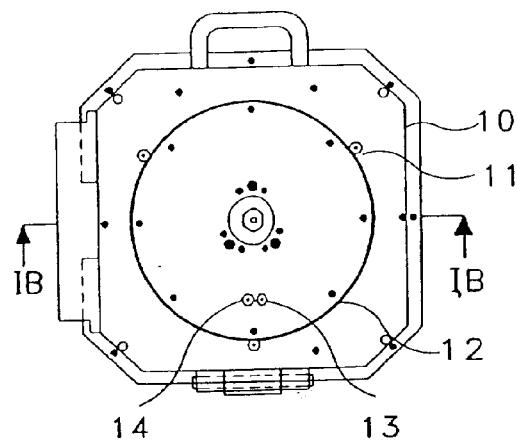
Figure 1B:
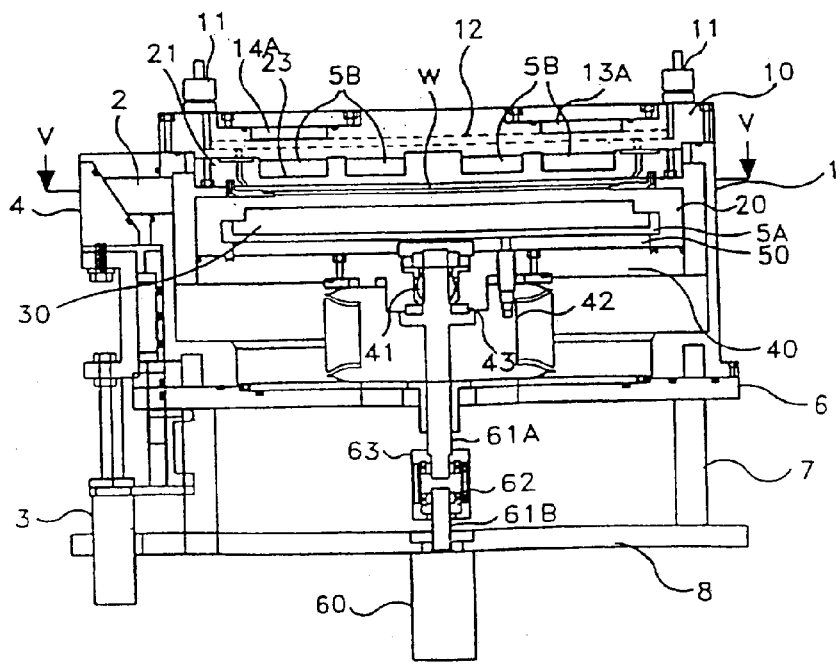
Figure 2:
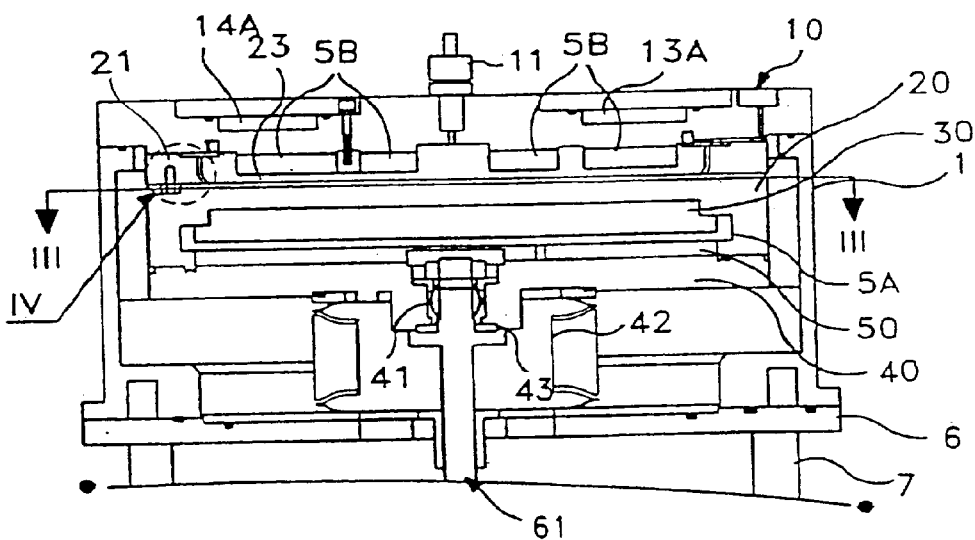
Figure 3:
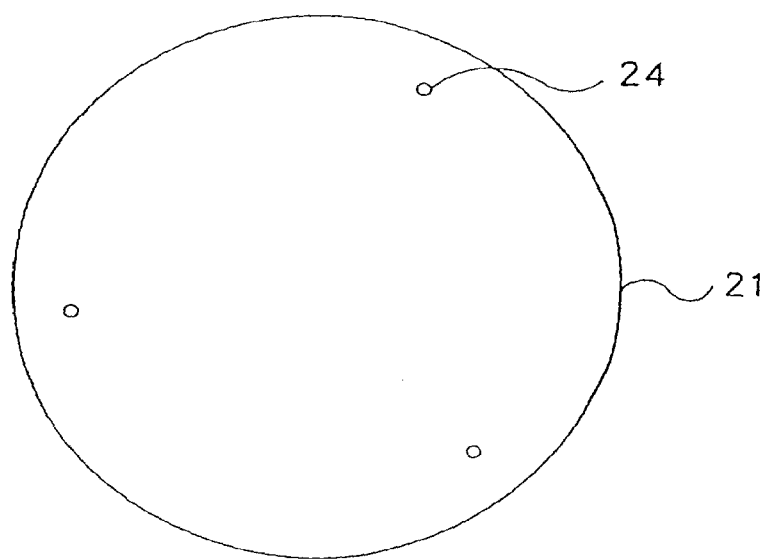
Figure 4:
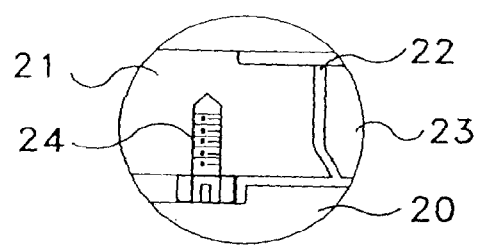
Figure 5:
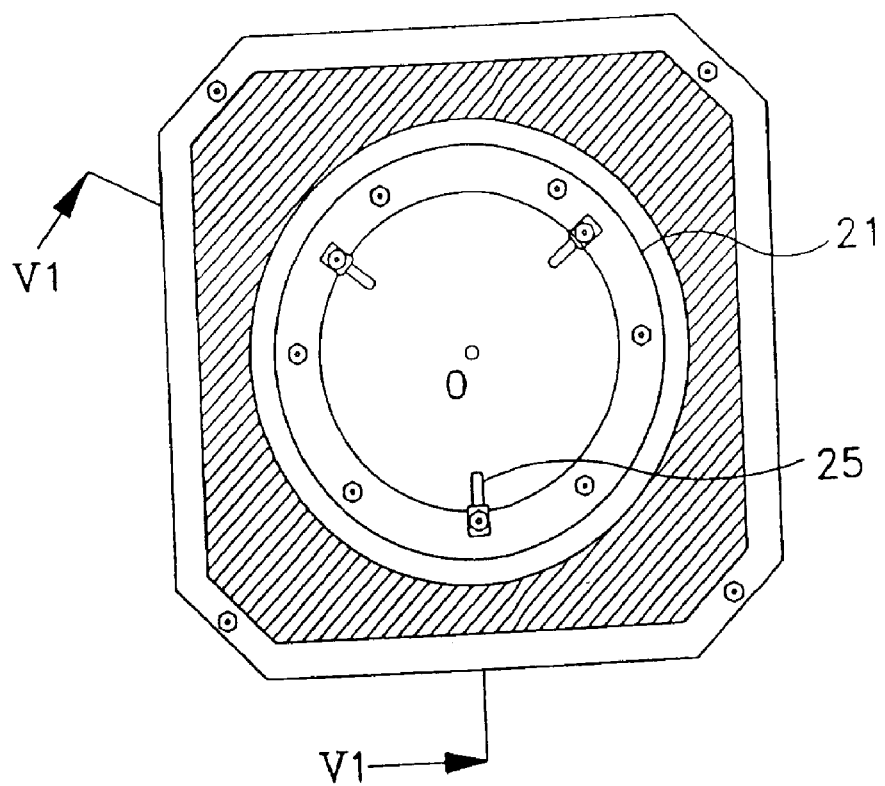
Figure 6:
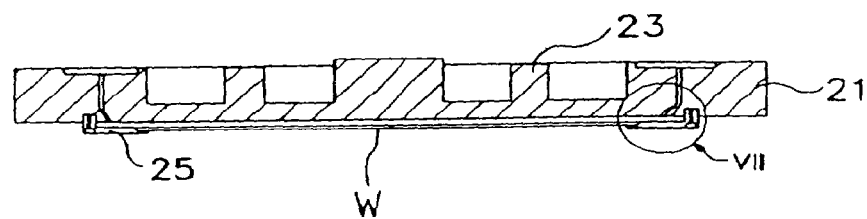
Figure 7:
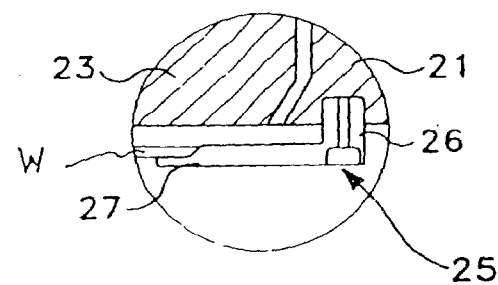
Figure 8:
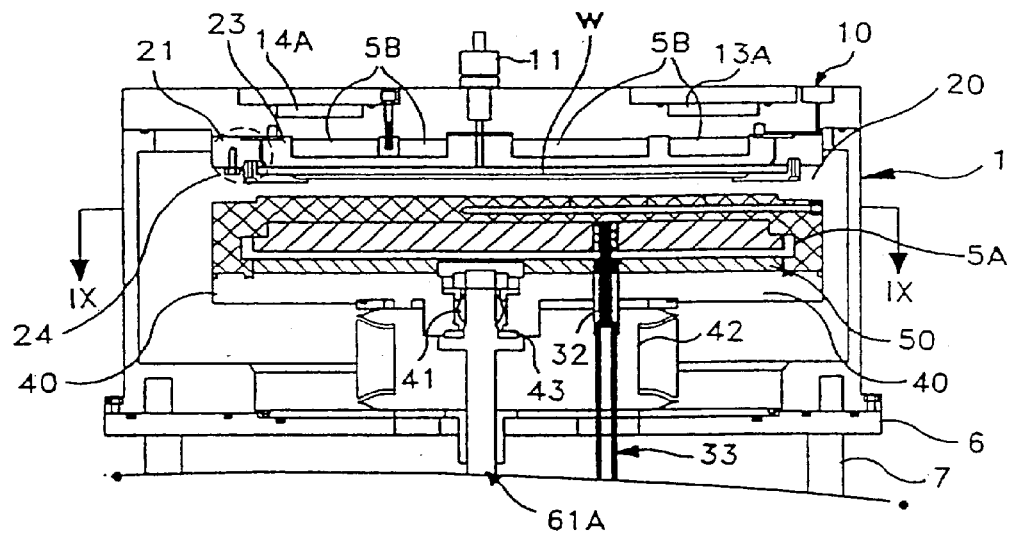
Figure 9:
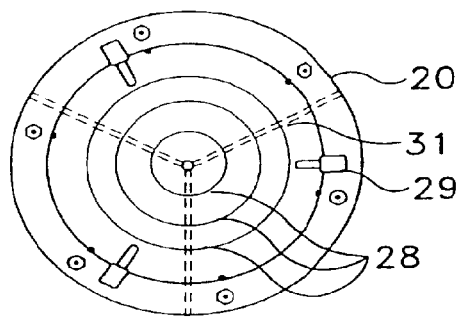
Figure 10:
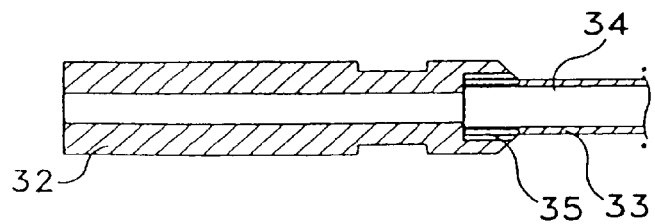

The insulating plate 50, as shown in FIGS. 14A & 14B is made of ceramic in order to prevent a heat of the heater 30 from conducting to the outside. A recess portion 49 is formed at the center of the insulating plate 50 as shown in FIG. 14 and the distal end of the rod 61 is inserted into the recess portion 49.

The operation of the ozone asher constructed above is described as follows.

When the rod 61 is moved down, the bellows 42 is contracted, and the pedestal 20, the heater 30, the insulating plate 50 and the swing disk 40 are moved down integrally. At this point, the slit door 4 is lowered by the first air cylinder 3 and the opening 2 is opened. The semiconductor substrate W is inserted into the chamber 1 and laid on the supporting part 27 of the holder 25. At this time, although the semiconductor substrate is located on the supporting part 27 in an inclined state, the semiconductor substrate is slid along the inclined surface of the supporting part 27 and is adjusted to its correct position.

When the first air cylinder 3 is moved up and the opening 2 is closed, the chamber 1 is closed. Afterwards, the rod 61 of the second air cylinder 60 is moved up in order to move the pedestal 20 upwards, and the semiconductor substrate holders 25 are inserted into the corresponding inlet holes 29 so that the semiconductor substrate is laid on the pedestal 20. At the same time, the vacuum pump provided in the pedestal 20 is operated and the vacuum pressure is supplied into the vacuum channels 31 through the vacuum paths 34 and the vacuum tubes 33 and finally supplied into each of the vacuum holes 28 so that the semiconductor substrate is drawn and held to the pedestal 20. At this time, since the vacuum holes 28 are distributed into the pedestal 20 in a uniform manner, the semiconductor substrate is held level to the pedestal 20.

When the pedestal 20 is moved up, it is stopped by contacting with the lower end of the gap spacers 24. In the meantime, if the pedestal 20 is sloped and is not contacted with any one of the gap spacer 24, the swing disk 40 is also sloped. Because the swing disk 40 can be pivoted at the ball link 41 fixed to the rod 61 which is operated to the sloped pedestal 20 so that the pedestal 20 is to be contacted with all of the gap spacers 24. Thus, the pedestal 20 is kept perfectly level. At this time, an impact generated by the contacting of the gap spacer 24 and the pedestal 20 is absorbed by any coil spring 62 so that the particle generation due to the impact is prevented. The generation of such particles would negatively affect the semiconductor substrate.

As described above, the semiconductor substrate is held to the pedestal 20 in a correct horizontal location. After the semiconductor substrate is held, electric power is supplied to the heater in order to heat the pedestal 20. The heating temperature of the pedestal 20 is preferably from 300° C. to 400° C. The temperature needs to be sufficient enough to convert the ozone into its radical components to carry out the proper etching process, but the ozone can be easily converted into the radical components at higher heating temperatures. If the heating temperature of the pedestal 20 is too low, the amount of the radical components converted from the ozone is very small and the proper etching process is not effective. On the contrary, if the heating temperature is too high, the ozone is converted into the radical components at the ozone injection hole 11, or the communicating hole 12 and the gap 22 before entering into the chamber 1, and the etching process is not effective.

The temperature control of the pedestal 20 is made by the thermocouple 44 in contact with the pedestal 20 to detect the temperature of the pedestal 20. If the end of the thermocouple 44 does not contact the pedestal 20 or, on the other hand, is over-inserted, the thermocouple cannot detect the temperature of the pedestal 20 correctly. As mentioned earlier, the end of the thermocouple 44 is supported by the springs 46 to ensure proper contact with the pedestal 20 so that the temperature can be accurately detected.

Also, in the present invention, the insulating plate 50 is provided on the lower side of the heater 30 so that the temperature of the chamber 1 can be kept constant. Additionally, spaces are formed between the chamber 1 and the pedestal 20, between the heater 30 and the insulating plate 50 and between the inner disk 23 and the upper cover 10 so that a heat loss to the outside is minimized.

When the temperature of the pedestal 20 reaches the proper level, the ozone is injected in the chamber 1 from three ozone injection holes 11. At this time, if a large amount of ozone is supplied to any portion of the semiconductor substrate concentrically at one time, the overetching is made at a specific portion with the remaining portions unetched. To prevent this problem, the ozone is dispersed through the passage 12 communicated with three ozone injection holes 11 and passed through the gap 22 (FIG. 4) formed in the inner and outer disks, 23 and 21, before reaching the semiconductor substrate. The ozone passed through the gap 22 is not injected vertically to the semiconductor substrate but is injected from the circumference of the semiconductor substrate to the its center after the flow speed of the ozone is lowered by the sloped portion of the cover. The injected ozone is converted into the radical components and the radical components react with the photoresist mask thereby cutting a linkage of C—H—O and removing the photoresist mask. Afterwards, the reaction gas is exhausted through the outlet hole.

When the photoresist mask has been removed, the vacuum pump is no longer operated, and the second air cylinder 60 is moved down so that the semiconductor substrate moves downwards with the pedestal 20 and lays on the holder 25. The first air cylinder 3 is operated to move the slit door 4 downwards so that the opening 2 is opened and the semiconductor substrate is withdrawn.

In accordance with the present invention, the chamber 1 is sealed effectively during the procedure and the semiconductor substrate is kept level thereby enhancing etching uniformity.

As described above, under the condition of fixing the cover, the pedestal is operated by the air cylinder to be raised and lowered. Thus, no pin hole is formed on the pedestal to receive the conventional lift pin, and the leakage of ozone through the pin hole is prevented.

Also, the rising and lowering movement of the pedestal is kept level by the spring provided between the gap spacer, the swing disk, the ball link and the rod, therefore etching uniformity is enhanced.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

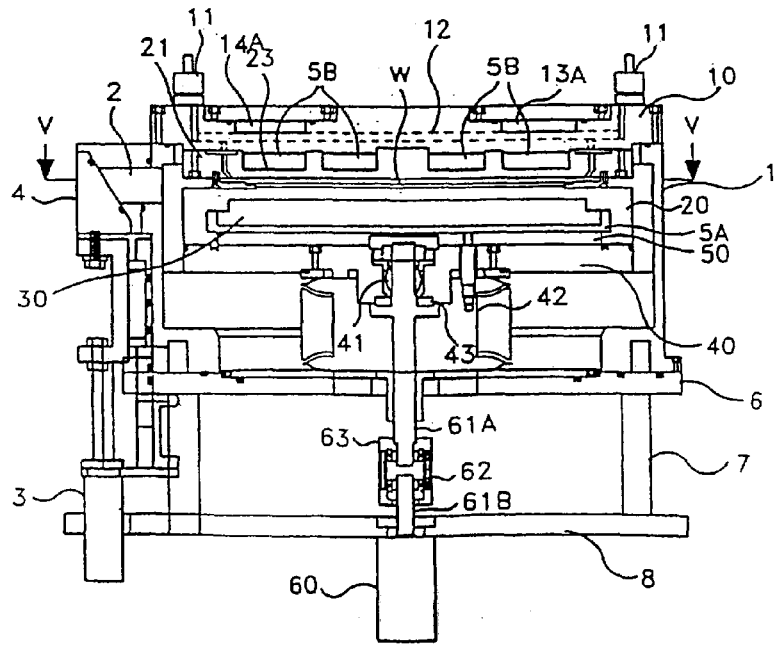

What is claimed is:

1. An ozone asher comprising:
   a chamber used as a closed space, having an opening through which a semiconductor substrate is inserted for etching and afterwards withdrawn, said chamber having ozone injection holes for supplying ozone into the chamber and a plurality of semiconductor substrate holders for keeping the semiconductor substrate in place when inserted into and withdrawn from the chamber;
   a pedestal in the chamber for supporting and raising the semiconductor substrate during said etching in a raised position of said pedestal;

vacuum means provided at the pedestal for drawing and holding the semiconductor substrate to the pedestal in said raised position;

a heater provided at the pedestal for heating the semiconductor substrate;

means for raising and lowering the pedestal and the heater;

means for keeping a gap between the pedestal and the upper cover during the supporting and raising of the semiconductor substrate; and a slit door for opening and closing the opening of the chamber selectively.

2. The ozone asher as claimed in claim 1 wherein the ozone injection holes are formed at three points of the upper cover separated by an equal angle of 120° respectively and communicated mutually through a circular passage.

3. The ozone asher as claimed in claim 1 further comprising an inner and an outer insulating disk provided inside the upper cover to make a constant gap between the ozone injection holes, thereby forming an insulating space between the inner disk and the upper cover.

4. The ozone asher as claimed in claim 1 wherein the upper cover has a cooling means comprising a coolant path for preventing ozone injected through the ozone injection holes from early conversion to radical components.

5. The ozone asher as claimed in claim 1 wherein the semiconductor substrate holders provided at the upper cover are located at three points around a center of the outer disk and set apart at equal angles to support the semiconductor substrate, wherein inlet holes corresponding to the positions and the shape of the holders are formed in the pedestal so that when the pedestal is raised to said raised position, the semiconductor substrate holders are accommodated in the inlet holes whereby the pedestal is positioned for said supporting the semiconductor substrate.

6. The ozone asher as claimed in claim 5 wherein the semiconductor substrate holders each include: a fixing part attached to a lower surface of the outer disk; a supporting part extended horizontally from the fixing part, the supporting part comprising an upper portion and a lower portion, wherein an inclined surface exists between the lower portion and the upper portion so that the semiconductor substrate is guided smoothly from the upper portion to the lower portion to be exactly placed thereon.

7. The ozone asher as claimed in claim 6 wherein an angle of the inclined surface is from 50° to 70°.

8. The ozone asher as claimed in claim 1 wherein the vacuum means comprises:

a plurality of annular vacuum grooves having various diameter from the center to its circumference;

vacuum channels communicating the vacuum grooves and formed inside the pedestal at equal angles of 120°;

vacuum pipes extended downwards from one end of the vacuum channels;

vacuum tubes connecting the vacuum pipes to a vacuum source pump; and female screws formed at an inner surface of the vacuum pipes and male screws formed at an outer surface of the vacuum tube for engaging one another.

9. The ozone asher as claimed in claim 1 wherein the heater comprises a heating coil adjacent the pedestal and an insulating plate adjacent the heater, for preventing heat conduction outside the ozone asher, and attached to the pedestal so as to be spaced from the pedestal.

10. The ozone asher as claimed in claim 9 further comprising a thermocouple for sensing a temperature of the heater provided through the pedestal so as to contact to the heater so that the temperature control of said etching is made possible.

11. The ozone asher as claimed in claim 9 wherein the insulating plate is made of ceramic.

12. The ozone asher as claimed in claim 1 wherein the means for raising and lowering the pedestal includes means attached to the bottom of the pedestal comprising: a swing disk supporting the pedestal together with the heater and the insulating plate; a rod of which one end is connected to the middle portion of the swing disk and extended downwards through a lower plate; and an air cylinder mounted on a base plate for raising and lowering the rod.

13. The ozone asher as claimed in claim 12 further comprising a ball link connecting the swing disk to the rod so that the swing disk can pivot along with said raising and lowering the pedestal, and a dish spring provided to the ball link so that over-pivoting of the swing disk is prevented.

14. The ozone asher as claimed in claim 13 further comprising a bellows tube provided between the swing disk and the lower plate as well as around a center of the rod so as to smooth movement of the swing disk with said raising and lowering the pedestal.

15. The ozone asher as claimed in claim 12 wherein the rod has an upper portion connected to the swing disk and a lower portion connected to the air cylinder, and the upper and lower portions of the rod are coupled by connecting members so as to keep a space between the upper and lower portions and a spring is provided inside the connecting members to support the upper and lower portions.

16. The ozone asher as claimed in claim 1 wherein the means for keeping a gap includes a plurality of gap spacers located at a lower surface of the outer disk, placed apart at equal angles of 120°, and contacted with the pedestal to prevent the pedestal from over-rising.

17. The ozone asher as claimed in claim 1 wherein the slit door is connected to an air cylinder and moved up and down so that the chamber is selectively opened and closed.

18. Apparatus for positioning a semiconductor substrate for etching in an ozone asher, having a pedestal for use in a chamber of the ozone asher for supporting the semiconductor substrate in an etching position with respect to ozone injection holes for supplying ozone into the chamber for heating therein for etching the semiconductor substrate, further comprising:

a swing disk for supporting the pedestal in the chamber;

a rod attached to the swing disk by a pivot for pivoting the swing disk;

means connected to the rod for raising the rod for raising the pedestal to the etching position of the semiconductor substrate; and gap keeping means in the chamber for keeping a gap between the pedestal and the chamber in the etching position of the semiconductor substrate.

19. The apparatus of claim 18, further comprising means for preventing over-pivoting of the swing disk.

20. The apparatus of claim 18, wherein the rod has a first portion connected to the swing disk and a second portion connected to the means for raising the rod wherein the first and second portions of the rod are coupled by connecting members for keeping a space therebetween.

* * * * *

UNITED STATES PATENT AND TRADEMARK OFFICE
CERTIFICATE OF CORRECTION

PATENT NO.    : 5,993,595
DATED         : November 30, 1999
INVENTOR(S)   : K. Bae et al.

It is certified that error appears in the above-identified patent and that said Letters Patent is hereby corrected as shown below:

Title page,
Should be deleted to be replaced with the attached title page.

Drawings,
Sheets 1-7 of the Drawings should be deleted to appear as per attached sheets.

Column 2,
Line 25, please cancel "o-shaped" and substitute -- O-shaped -- therefor; and at
Line 30, please cancel "o-shaped" and substitute -- --O-shaped -- therefor.

Column 5,
Line 25, please cancel "entered" and substitute -- inserted -- therefor; and at
Line 32, cancel "infection" and substitute -- injection -- therefor.

Column 6,
Line 62, after "14B", please insert a comma.

Signed and Sealed this

Sixth Day of August, 2002

Attest:

JAMES E. ROGAN
*Attesting Officer*     *Director of the United States Patent and Trademark Office*

United States Patent [19]
Bae et al.

[11] Patent Number: 5,993,595
[45] Date of Patent: Nov. 30, 1999

[54] OZONE ASHER

[75] Inventors: Koon-Ho Bae, Seoul; Sang-Yun Lee, Ichon; Hyung-Chang Kang, Ichon; Cheong-Dai Lee, Ichon; Roh-Young Sung; Sun-Dong Park, both of Seoul; Jong-Hyun Park, Ichon, all of Rep. of Korea

[73] Assignee: Hyundai Electronics Industries Co., Ltd., Kyoungki-do, Rep. of Korea

[21] Appl. No.: 08/728,639

[22] Filed: Oct. 10, 1996

[30] Foreign Application Priority Data

Oct. 10, 1995 [KR] Rep. of Korea .................. 95/28278

[51] Int. Cl.⁶ .................................................. H05H 1/00
[52] U.S. Cl. .................................................. 156/345
[58] Field of Search ........................ 156/345; 118/728, 118/729, 725, 500; 204/298.15, 298.33, 298.07

[56] References Cited

U.S. PATENT DOCUMENTS

| | | |
|---|---|---|
| 4,812,201 | 3/1989 | Sakai et al. |
| 4,838,978 | 6/1989 | Sekine et al. ............ 156/345 |
| 5,176,782 | 1/1993 | Ishibashi et al. ......... 156/345 |
| 5,558,717 | 9/1996 | Zhao et al. .............. 118/715 |

FOREIGN PATENT DOCUMENTS 63-32927  2/1988  Japan.

*Primary Examiner*—Thi Dang
*Attorney, Agent, or Firm*—Ware, Fressola, Van Der Sluys & Adolphson LLP

[57] ABSTRACT

An ozone asher includes: a chamber having a closed space isolated from an atmosphere, and an opening through which the semiconductor substrate to be etched is inserted and withdrawn from the chamber; an upper cover forming an upper portion of the chamber, having ozone injection holes for supplying ozone into the chamber; a plurality of holders for holding the semiconductor substrate inserted in the chamber through the opening; a pedestal provided to be raised and lowered in the chamber and supporting the semiconductor substrate during the whole procedure; vacuum means provided at the pedestal for drawing and holding the semiconductor substrate to the pedestal; heating means for the semiconductor substrate provided at the pedestal; means for raising and lowering the pedestal and the heating means; means for keeping a gap between the pedestal and the upper cover during the elevating of the semiconductor substrate; and a slit door for opening and closing the opening of the chamber selectively.

20 Claims, 11 Drawing Sheets